(12) United States Patent
Hess

(10) Patent No.: US 6,546,868 B2
(45) Date of Patent: Apr. 15, 2003

(54) PRINTING FORM AND METHOD OF MODIFYING THE WETTING CHARACTERISTICS OF THE PRINTING FORM

(75) Inventor: Peter Hess, Heidelberg (DE)

(73) Assignee: Heidelberger Druckmaschinen AG, Heidelberg (DE)

(*) Notice: Subject to any disclaimer, the term of this patent is extended or adjusted under 35 U.S.C. 154(b) by 0 days.

(21) Appl. No.: 09/822,030

(22) Filed: Mar. 29, 2001

(65) Prior Publication Data

US 2002/0035938 A1 Mar. 28, 2002

Related U.S. Application Data

(63) Continuation of application No. PCT/EP99/07119, filed on Sep. 24, 1999.

(30) Foreign Application Priority Data

Oct. 10, 1998 (DE) .......................... 198 46 808

(51) Int. Cl.[7] .............................. B41N 1/14; B41C 1/10
(52) U.S. Cl. ...................... 101/453; 101/465; 101/467; 101/478
(58) Field of Search .................... 101/455, 456, 101/463.1, 465, 466, 467, 478, 453

(56) References Cited

U.S. PATENT DOCUMENTS

| | | | | |
|---|---|---|---|---|
| 3,271,591 A | * | 9/1966 | Ovshinsky | 327/500 |
| 3,530,441 A | * | 9/1970 | Ovshinsky | 101/467 |
| 3,615,937 A | * | 10/1971 | Collins et al. | 438/542 |
| 3,678,852 A | * | 7/1972 | Feinleib et al. | 101/465 |
| 3,844,790 A | * | 10/1974 | Chang et al. | 430/300 |
| 5,109,240 A | * | 4/1992 | Engl et al. | 101/401 |
| 5,206,102 A | * | 4/1993 | Tench | 101/467 |
| 5,911,176 A | * | 6/1999 | Buschulte | 101/465 |
| 5,927,206 A | * | 7/1999 | Bacon et al. | 101/465 |
| 6,014,930 A | * | 1/2000 | Burberry et al. | 101/467 |
| 6,210,845 B1 | * | 4/2001 | Hotta et al. | 101/467 |
| 6,294,313 B1 | * | 9/2001 | Kobayashi et al. | 101/467 |

* cited by examiner

Primary Examiner—Stephen R. Funk
(74) Attorney, Agent, or Firm—Laurence A. Greenberg; Werner H. Stemer; Ralph E. Locher

(57) ABSTRACT

The printing form, such as a printing plate or the surface of a printing cylinder, has a semiconducting surface with defined hydrophobic and hydrophilic areas corresponding to a print image to be printed with the printing form. The wetting characteristics of the printing form can be altered. To this end, the surface of the printing form is first placed into an essentially uniform chemical state with a first wetting behavior. Parts of all of the areas of the semiconductor surface are then put into a second chemical state which has a second wetting property that is different from the first.

28 Claims, 2 Drawing Sheets

PRINTING FORM AND METHOD OF MODIFYING THE WETTING CHARACTERISTICS OF THE PRINTING FORM

CROSS-REFERENCE TO RELATED APPLICATION

This application is a continuation of copending International Application No. PCT/EP99/07119, filed Sep. 24, 1999, which designated the United States.

BACKGROUND OF THE INVENTION

Field of the Invention

The invention lies in the printing technology field and relates, more specifically, to a method of modifying the wetting properties of a printing form having a semiconducting surface, and a printing form having a semiconducting surface which has different wetting properties. The invention further pertains to the use of the novel concept in an offset printing process.

European patent EP 262 475 B1 describes a printing press which is equipped with a printing form on which an image to be printed can be represented by corresponding hydrophobic and hydrophilic regions. To permit switching between the hydrophilic and hydrophobic state in the individual regions, ferroelectric material which is locally polarizable and depolarizable is provided on the printing form. The hydrophilization or rehydrophilization of the printing form is accordingly effected by a polarization or depolarization mechanism which can be carried out reversibly within the printing press. However, the disadvantage of this process is that the effect is based on long-range electrostatic attractive forces and accordingly the resolution of the image to be printed is limited by the long-range electrical attractive forces.

U.S. Pat. No. 3,678,852 discloses a printing form which is coated with an amorphous semiconductor. The amorphous state of the semiconductor can be changed with the aid of a laser beam from the disordered amorphous state to a more highly ordered crystalline state. In the crystalline state, the semiconducting surface is rougher so that the reordering of the semiconducting surface results in liquids adhering better in the region of the rougher surface than in the amorphous smooth regions. The resolution of the printing form produced according to that process is limited by the minimum size of the crystalline regions.

SUMMARY OF THE INVENTION

It is accordingly an object of the invention to provide a printing form and a method of defining its wetting characteristics, which overcome the above-mentioned disadvantages of the heretofore-known devices and methods of this general type and which provides for an alternative process for locally and repeatedly modifying the wetting properties of a printing form having a semiconducting surface and to propose a corresponding printing form.

With the foregoing and other objects in view there is provided, in accordance with the invention, a method of modifying a wetting characteristic of a printing form, such as a printing plate or a printing cylinder, with a semiconducting surface. The novel method comprises the following steps:

bringing a semiconducting surface of a printing form into a first chemical state having a first wetting property; and bringing a portion of the semiconducting surface into a second chemical state having a second wetting property different from the first wetting property.

In accordance with an added feature of the invention, the second chemical state is set by modifying chemical terminal groups of the semiconducting surface and/or modifying a chemical property of first atomic layers in a surface region of the semiconductor having the semiconducting surface.

The basic concept of the present invention is found in the modification of the local wetting behavior, i.e. the local hydrophilic or hydrophobic behavior of a printing form, by controlling the chemical terminal groups of the surface with correspondingly different electronic properties, i.e. interaction properties. For this purpose, a surface having a chemical structure which has a preferably essentially uniform hydrophilic or hydrophobic wetting property is first produced. This surface is then converted in localized areas by localized modification of the chemical structure into the respective other state of the wetting property, i.e. from hydrophilic to hydrophobic or from hydrophobic to hydrophilic. In the case of this chemical switching process, it is not necessary to use special ferromagnetic materials or to produce a modification of the surface roughness, for example by crystallization. Rather, the wetting behavior in the individual regions of the semiconducting surface is controlled by providing the semiconducting surface in a controlled manner with hydrophilic and hydrophobic chemical terminal groups.

This localized switching process can be effected, for example, with the aid of so-called chemical processing, in which the chemical conversion is effected by photothermal or photochemical, or generally by means of laser-induced, reaction processes.

In accordance with an additional feature of the invention, the first chemical state is produced by layer removal at the surface of the semiconductor in an atomic dimension. The layer removal may be carried out with HF or an ammonium fluoride solution.

In accordance with another feature of the invention, the second chemical state may be produced by localized chemical processing in regions of the semiconducting surface.

In accordance with again an added feature of the invention, the surface is processed with a controlled energy source and the energy source is controlled such that the second chemical state is produced to correspond to image information to be printed with the printing form or to its negative.

In a preferred embodiment of the invention, the controlled energy source is a laser, for instance a pulsed laser, or a source of non-coherent energy (i.e., a conventional energy source), such as a UV lamp.

In accordance with again another feature of the invention, the printing form surface is processed with a fluorine laser having a VUV wavelength of 157 nm, an excimer laser having a UV wavelength ≦308 nm, or a solid-state laser having a wavelength ≦355 nm.

A particularly suitable energy source is an Nd:YAG laser.

In a preferred embodiment, silicon is chosen as the semiconductor. This semiconducting surface is first converted into a hydrophobic state, with, for example, SiH, $SiH_2$ and/or $SiH_3$ groups being introduced into the surface or applied to the surface. In order to change the hydrophobic behavior, the hydrophobic group is then exchanged locally for a hydrophilic group or is converted into such a group so that, for example, SiOH, SiOSi and/or SiO units replace the hydrophobic groups.

When a silicon face is used as the surface of the printing form, there is a particular advantage that the surface is atomically smooth and the hydrophilic or hydrophobic terminal groups can be applied essentially the same distances apart.

Various processes are suitable for producing a hydrophilic or hydrophobic starting layer and for the switching process between hydrophilic and hydrophobic.

Thus, for example for the production of a uniform hydrophilic surface, the printing form can be subjected to a suitable wet chemical modification process, with the result that, under suitable conditions, it is possible to produce highly hydrophilic wettability of the surface which is caused, for example, by the incorporation of SiOH and/or SiO groups into the first atomic layers of the semiconducting surface. By exposure to a laser of suitable wavelength, in particular to a pulsed laser, this hydrophilic wetting property can now be changed specifically and locally into a hydrophobic wetting property by replacing the hydrophilizing group by a hydrophobic surface configuration.

However, a process taking place in the opposite direction is also possible. Here, an essentially hydrophobic surface of the printing form is first produced. For this purpose, the printing form can, for example, be treated with a dilute HF solution or an ammonium fluoride solution, only the uppermost layers of the semiconductor being removed and a hydrophobic, hydrogen-terminated surface forming. This can then be hydrophilized again in individual regions, energy being supplied locally to these regions.

After the use of the printing form, i.e. after printing, the total surface can be converted back into the starting state.

The printing form is then available before being provided with further images.

With the method according to the invention, it is possible to provide a printing form which can be repeatedly provided with images and can thus be reused in many successive cycles. In addition, the resolution of the printing form is not limited by the size of the crystals or an electrical interaction.

With the above and other objects in view there is also provided, in accordance with the invention, a printing form, comprising:

a semiconducting surface carrying a pattern of hydrophilic regions and hydrophobic regions;

the hydrophilic regions having a first chemical state and the hydrophobic regions having a second chemical state differing from the second chemical state.

As noted above, the semiconducting surface is formed on a printing plate or on a printing cylinder or printing roller.

In accordance with again a further feature of the invention, the semiconducting surface is formed by silicon, germanium, or an alloy of silicon and germanium. The phase of the semiconductor may be amorphous, polycrystalline, and/or crystalline.

Specific semiconducting material are SiGe, SiC, and SiCN.

In accordance with a concomitant feature of the invention, the second chemical state extends to a thickness of no more than 5 nm from the semiconductor surface into a semiconductor material defining the semiconductor surface.

Other features which are considered as characteristic for the invention are set forth in the appended claims.

Although the invention is illustrated and described herein as embodied in a printing form and method of modifying the wetting characteristics of the printing form, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
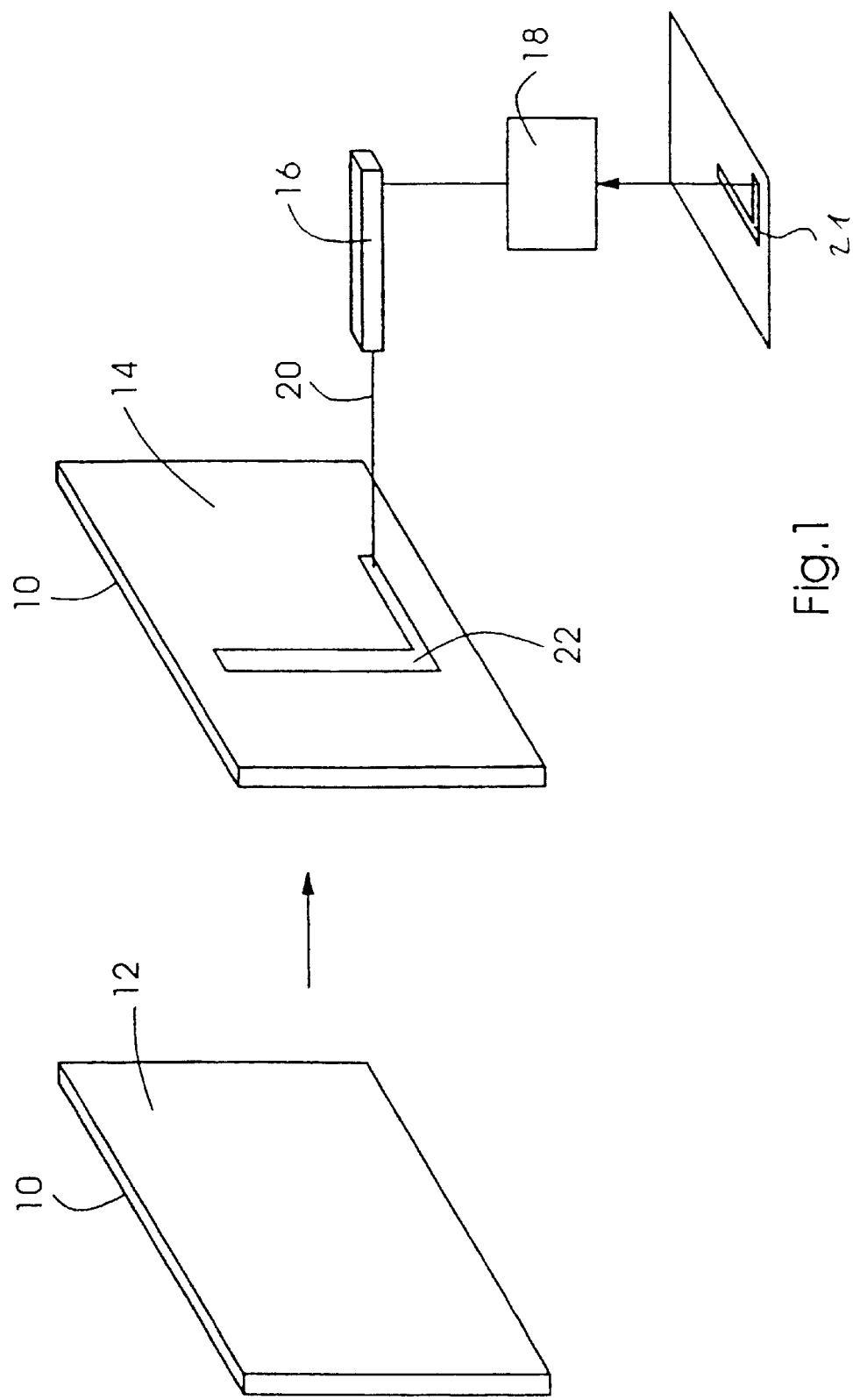
FIG. 1 is a perspective diagrammatic view illustrating the method according to the invention.

Referring now to the figures of the drawing in detail and first, particularly, to FIG. 1 thereof, the starting point of the method according to the invention is a printing form 10 which, as shown in FIG. 1, may be in the form of a printing plate or a printing cylinder. The printing form 10 has a surface layer 12 of a semiconductor, in particular silicon, which is applied to the printing form. After its production process, this starting printing form is usually covered with a natural, i.e. not exactly defined, oxide layer whose thickness is usually from 1 to 3 nm.

In a first process step according to the invention, this printing form is converted into a printing form having a defined essentially hydrophobic surface layer 14. For this purpose, the surface layer 12 of the printing form 10 is hydrogen-terminated. That is to say, the free valences, for example of the silicon surface atoms, are saturated with hydrogen Depending on the crystal face which is present at the surface of the semiconductor, the semiconductor, which is preferably silicon, can bind one or more hydrogen atoms. In the case of the silicon crystal face, a hydrogen atom accordingly undergoes addition at each silicon atom, perpendicular to the surface. In the case of the crystal face or other crystal faces of the silicon, a plurality of free valences may be present per silicon atom at the surface, so that two or more hydrogen atoms can undergo addition at the silicon surface atom. Since the polycrystalline silicon surface consists of a mixture of different crystal faces, it follows that the polycrystalline or amorphous semiconducting surface comprises a mixture of mono-, di- and trihydrides.

The hydrogen termination process described above for producing a hydrophobic semiconducting surface can be carried out, for example, by treating the surface with a dilute HF solution or a buffered ammonium fluoride solution. Only the uppermost layers of the semiconductor are thereby removed in an atomic dimension to a few nanometers and the hydrophobic hydride layer described above forms.

While in the case of a single crystal the use of a buffered $NH_4F$ solution (pH≈8) leads to further leveling, i.e. to an atomically flat surface, which ideally has only atomic steps, along the Si(111) plane owing to the anisotropic etching process, in the case of a polycrystalline silicon surface the microscopic roughness is increased by the anisotropic etching process. Using a dilute HF solution, on the other hand, only the oxide layer is removed, i.e. the microscopic roughness is not changed, in the case of a polycrystalline silicon surface. After this operation, the printing form 10 thus has a hydrophobic surface 14 which can be used for the further method according to the invention.

The hydrophobic surface 14 of the printing form 10 is now hydrophilized in regions of its surface in a further process step. This can be effected, for example, by subjecting the surface regions to be hydrophilized to chemical transformation locally and thus locally dehydrogenating the surface and occupying the dehydrogenated sites of the surface with hydrophilic groups. For local modification of the surface, two processes have proven particularly suitable. As shown in FIG. 1, the local energy supply and initiation of the process can be effected, for example, by means of a laser 16. Particularly suitable are pulsed lasers which have a small beam cross-section, so that the dehydrogenation can be carried out in a spatially limited region. A laser which may be used is, for example, a so-called VUV fluorine laser having a wavelength of 157 nm, if the surface modification is to be carried out photochemically.

For a photothermal modification which, depending on the hydride, requires local heating to 300–550° C., all UV lasers are in principle suitable, such as, for example, gas lasers (excimer lasers) and solid-state lasers (e.g. frequency-multiplied Nd:YAG lasers).

These lasers are usually controlled by a control unit 18, with the aid of which the beam 20 of the laser 16 is guided over the printing form, and is switched on and off or focused and masked out so that a pattern 22 to be printed or the negative of the pattern can be introduced as a hydrophobic image in an otherwise hydrophobic surface 14. This molecular property change on the surface of the printing form cannot usually be detected with the naked eye. The applied printing image 22 usually corresponds to an original image 21, which may be produced in a different manner. Thus, all known digitizing methods for an original and the direct digital production of the image, for example with the aid of a graphics program or of a digital camera, are suitable.

Usually, these images are then stored in a so-called RIP (Raster Imaging Processor). It is thereby possible for the memory to be located in the control unit 18 or outside. On the basis of the data stored in the RIP, the laser beam 16 is then controlled in such a way that the image 22 is applied to the printing form 10. In addition to this image generation by the local supply of energy with the aid of a laser, it is also possible to apply the energy more extensively, for example by means of a lamp, such as, for example, a UV lamp (in particular a commercially available excimer lamp having various UV wavelengths). It is particularly advantageous to cover the printing form with a mask before the irradiation of the printing form, so that the lamp can act on the surface 14 of the printing form 10 only in specific regions.

With the aid of the two processes, it is accordingly possible to produce a modified, second chemical state, which is hydrophilic, on the hydrophobic surface 14 of the printing form 10 by a local photo-induced reaction process, in specific areas.

Figure 2:
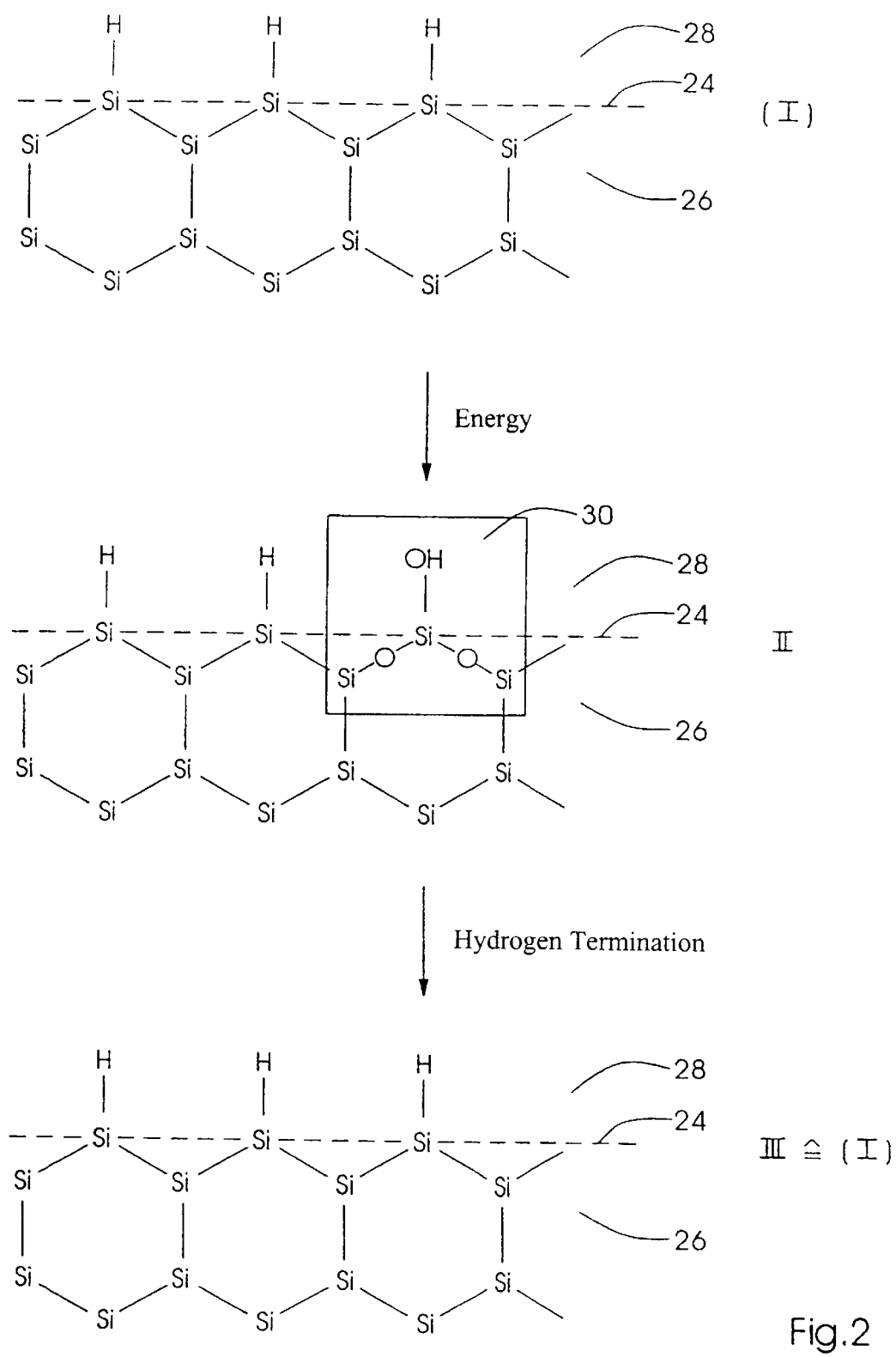
FIG. 2 is a diagram illustrating the principle for changing a semiconducting surface from hydrophilic to hydrophobic for the terminal groups SiH and SiOH by way of example.

FIG. 2 shows, in a schematic and idealized form, the structural formula of a silicon semiconductor solid on the surface 24, the separation line 24 ideally separating the solid-state region 26 from the region 28 outside the solid. Each silicon atom present on the surface line 24 has a free valence which, in the case of the hydrogen-terminated surface of the silicon semiconductor, is monohydrogenated, i.e. saturated with one hydrogen atom. By means of a photoinduced process, this surface state is dehydrogenated in the region 30 and is converted into a second chemical state which is hydrophilic. This hydrophilic state is distinguished on the one hand by a hydrophilic group located outside the boundary line 24 of the semiconductor, in the present case OH. In addition, it is also possible to incorporate oxygen atoms in the surface region in one or more atomic layers of the semiconductor 26, so that the hydrophilic wetting property is even further enhanced in these regions. A printing form surface treated in this manner thus has first chemical states which are hydrophobic and second chemical states which are hydrophilic. Owing to this differing attraction behavior with respect to water, the printing form can be used for offset printing.

After printing, the ink accumulated on the surface 24 of the semiconductor is removed by conventional processes for washing off ink. It is particularly easy to remove the printing ink in the context of the invention since, in the method according to the invention, only microscopic roughnesses are introduced into the surface, and the difference between hydrophobic and hydrophilic is produced on the basis of the chemical composition of the surface and of the modified regions located directly below the surface. As soon as the printing ink has been removed from the surface of the printing form, the printing form can be converted back to its original hydrophobic state by subjecting the surface to a treatment which hydrogen-terminates the surface once more so that the original state (I) is reached. This can be effected, for example, if regions of an atomic order of magnitude (a few monolayers) are removed from the surface, as shown in FIG. 2 (II), and thus a pure silicon surface forms again, which can be readily saturated with hydrogen atoms.

For example, the treatment of the surface with an ammonium chloride/HF solution is suitable as one of the chemical processes which may be used, the uppermost layer being removed with the aid of this process and at the same time the hydrogen termination of the surface being effected.

The process shown in FIG. 2 relates to a silicon surface in which the crystal plane is exposed at the surface of the silicon solid. Of course, it is also possible for the surface to be polycrystalline, i.e. for a mixture of different crystal planes to be present at the surface. The hydrophobic properties can thus be enhanced. In particular, for example, the crystal face and other crystal faces will occur at the surface of the silicon solid so that additional free valences can be saturated by further hydrogen atoms.

In addition to the wet chemical process already described for the hydrogen termination, all other processes which give rise to essentially complete hydrogen termination or alkylation of the silicon semiconductor surface are also suitable.

The procedure according to the invention and described so far has the object of locally hydrophilizing a hydrophobic starting surface. According to the invention, however, the reverse procedure is also possible, in which a hydrophilic surface is rendered hydrophobic in these regions by a local photoinduced process. In order to achieve this, a hydrophilic surface is first produced, which can be effected, for example, by treating the printing form with $H_2O_2$ by a wet chemical method. A further possibility comprises laser-induced oxidation in a moist atmosphere.

By irradiation with a laser in the presence of alcohol (e.g. $CH_3OH$), the OH groups are removed from the surface. Hydrophobic $SiCH_3$ or $SiOCH_3$ groups also form in addition to SiH groups. Consequently, the printing form becomes hydrophobic with respect to water in the irradiated areas and is thus suitable for the printing process.

In addition to the silicon described, as a semiconductor, germanium or an alloy which contains germanium and silicon (SiGe) as well as SiC or SiCN may also be used.

The proposed process can be used inside or outside the printing press, so that, for many applications of offset printing, there is the major advantage that the printing form is reusable. Particularly when the process is used inside a printing press, there is a substantial advantage in terms of time since the printing form need not be removed.

I claim:

1. A method of modifying a wetting characteristic of a printing form having a semiconducting surface, which comprises;

bringing a semiconducting surface of a printing form into a first chemical state having a first wetting property; and bringing a portion of the semiconducting surface into a second chemical state having a second wetting property different from the first wetting property by modifying chemical terminal groups of the semiconducting surface.

2. The method according to claim 1, wherein the first wetting property is hydrophilic and the second wetting property is hydrophobic.

3. The method according to claim 1, wherein the first wetting property is hydrophobic and the second wetting property is hydrophilic.

4. The method according to claim 1, which comprises producing the first chemical state by layer removal at the surface of the semiconductor in an atomic dimension.

5. The method according to claim 4, which comprises carrying out the layer removal with HF.

6. The method according to claim 4, which comprises carrying out the layer removal with an ammonium fluoride solution.

7. The method according to claim 1, which comprises producing the second chemical state by localized chemical processing in regions of the semiconducting surface.

8. The method according to claim 7, which comprises processing with a controlled energy source and controlling the energy source such that the second chemical state is produced to correspond to image information to be printed with the printing form.

9. The method according to claim 7, which comprises processing with a controlled energy source and controlling the energy source such that the second chemical state is produced to correspond to a negative of image information to be printed with the printing form.

10. The method according to claim 7, which comprises processing with a controlled energy source selected from the group consisting of a laser and a source of non-coherent energy.

11. The method according to claim 10, which comprises processing with an energy source selected from the group consisting of a pulsed laser and a UV lamp.

12. The method according to claim 7, which comprises processing with a laser selected from the group consisting of a fluorine laser having a VUV wavelength of 157 nm, an excimer laser having a UV wavelength $\leq$308 nm, and a solid-state laser having a wavelength $\leq$355 nm.

13. The method according to claim 7, which comprises processing with an Nd:YAG laser.

14. The method according to claim 1, which comprises providing the printing form with a semiconducting material selected from the group consisting of silicon, germanium, and an alloy of silicon and germanium in a phase selected from the group consisting of amorphous, polycrystalline, and crystalline.

15. The method according to claim 14, which comprises providing the printing form with a semiconducting material selected from the group consisting of SiGe, SiC, and SiCN.

16. The method according to claim 1, which comprises achieving the second chemical state by localizing modification of a chemical structure of the semiconducting surface in a surface region, the surface region having a thickness of up to 5 nm.

17. The method according to claim 1, which further comprises:

using silicon as the semiconducting surface;

bringing the semiconducting surface of the printing form into the first chemical state by introducing into the semiconducting surface hydrophobic groups selected from the group consisting of $SiH$, $SiH_2$, and $SiH_3$.

18. The method according to claim 17, which further comprises:

bringing the portion of the semiconducting surface into the second chemical state by exchanging at least some of the hydrophobic groups with hydrophilic groups selected from the group consisting of $SiOH$, $SiOSi$, and $SiO$.

19. A printing form, comprising:

a semiconducting surface carrying a pattern of hydrophilic regions and hydrophobic regions;

the hydrophilic regions having hydrophilic chemical terminal groups and the hydrophobic regions having hydrophobic chemical terminal groups.

20. The printing form according to claim 19, wherein the semiconducting surface is formed on a printing plate.

21. The printing form according to claim 19, wherein the semiconducting surface is formed on a printing cylinder.

22. The printing form according to claim 19, wherein the hydrophobic regions correspond to image information to be printed with the printing form.

23. The printing form according to claim 19, wherein the hydrophobic regions correspond to a negative of image information to be printed with the printing form.

24. The printing form according to claim 19, wherein said semiconducting surface is formed by a semiconducting material selected from the group consisting of silicon, germanium, and an alloy of silicon and germanium in a phase selected from the group consisting of amorphous, polycrystalline, and crystalline.

25. The printing form according to claim 19, wherein said semiconducting material is a material selected from the group consisting of SiGe, SiC, and SiCN.

26. The printing form according to claim 19, wherein the second chemical state extends to a thickness of no more than 5 nm from said semiconductor surface into a semiconductor material defining said semiconductor surface.

27. The printing form according to claim 19, wherein:

said semiconducting surface is composed from silicon; and said hydrophobic regions including hydrophobic groups selected from the group consisting of $SiH$, $SiH_2$, and $SiH$.

28. The printing form according to claim 27, wherein said hydrophilic regions include hydrophilic groups selected from the group consisting of $SiOH$, $SiOSi$, and $SiO$.

* * * * *